United States Patent
Baransi et al.

(10) Patent No.: US 10,229,235 B2
(45) Date of Patent: Mar. 12, 2019

(54) SEQUENTIAL NON-DETERMINISTIC DETECTION IN HARDWARE DESIGN

(71) Applicant: Reveal Design Automation, Ann Arbor, MI (US)

(72) Inventors: Akram Baransi, Nazareth (IL); Michael Zajac, Midland, MI (US); Zaher Andraus, San Jose, CA (US)

(73) Assignee: Reveal Design Automation, Ann Arbor, MI (US)

( * ) Notice: Subject to any disclaimer, the term of this patent is extended or adjusted under 35 U.S.C. 154(b) by 36 days.

(21) Appl. No.: 14/826,105

(22) Filed: Aug. 13, 2015

(65) Prior Publication Data

US 2015/0347639 A1 Dec. 3, 2015

Related U.S. Application Data

(63) Continuation of application No. 13/909,747, filed on Jun. 4, 2013, now Pat. No. 9,141,738.

(60) Provisional application No. 61/689,347, filed on Jun. 4, 2012.

(51) Int. Cl.
*G06F 17/50* (2006.01)

(52) U.S. Cl.
CPC ........ *G06F 17/504* (2013.01); *G06F 17/5022* (2013.01)

(58) Field of Classification Search
CPC ............................ G06F 17/504; G06F 17/5022
USPC .................................................. 716/106–108
See application file for complete search history.

(56) References Cited

U.S. PATENT DOCUMENTS

| 5,495,409 | A | * | 2/1996 | Kanno | G05B 19/042 700/79 |
| 5,645,216 | A | * | 7/1997 | Benenowski | E01B 9/42 238/283 |
| 6,102,959 | A | * | 8/2000 | Hardin | G06F 17/504 703/13 |
| 6,311,293 | B1 | * | 10/2001 | Kurshan | G06F 17/504 703/13 |
| 7,149,987 | B2 | * | 12/2006 | Zhu | G06F 11/3608 716/103 |
| 8,015,521 | B2 | * | 9/2011 | Moon | G06F 17/5031 716/106 |
| 8,490,037 | B2 | * | 7/2013 | Chen | G06F 17/5022 703/16 |
| 2007/0033552 | A1 | * | 2/2007 | Li | G06F 17/5022 716/103 |
| 2007/0220461 | A1 | * | 9/2007 | Baumgartner | G06F 17/504 716/103 |
| 2008/0126768 | A1 | * | 5/2008 | Nakata | G06F 17/5022 712/227 |
| 2009/0216513 | A1 | * | 8/2009 | Pidan | G06F 17/504 703/14 |

(Continued)

*Primary Examiner* — Stacy Whitmore
(74) *Attorney, Agent, or Firm* — Douglas L. Weller (57) ABSTRACT

The use of X's in RTL design is widely common for improving synthesis results and, in some cases, verification effectiveness. However, it has certain implications on verification completeness. Human design error or flawed synthesis may lead to undesirable non-determinism on design outputs, not always detected consistently by simulators. This disclosure presents a framework for formalizing observable behavior on digital design output, and a proof methodology for detecting non-determinism or proving correctness with respect to observable X, using a model checker.

19 Claims, 5 Drawing Sheets

(56) References Cited

U.S. PATENT DOCUMENTS

| | | | |
|---|---|---|---|
| 2009/0300563 A1* | 12/2009 | Moon | G06F 17/5031 |
| | | | 716/106 |
| 2010/0313175 A1* | 12/2010 | Petlin | G06F 17/504 |
| | | | 716/106 |
| 2011/0093825 A1* | 4/2011 | Baumgartner | G06F 17/504 |
| | | | 716/108 |

* cited by examiner

SEQUENTIAL NON-DETERMINISTIC DETECTION IN HARDWARE DESIGN

CROSS-REFERENCE TO RELATED APPLICATIONS

This application claims the benefit of U.S. Provisional Application No. 61/689,347 filed Jun. 4, 2012. The entire disclosure of the above application is incorporated herein by reference.

FIELD

The present disclosure relates to automated verification and optimization of complex hardware designs.

BACKGROUND

Automating and scaling pre-silicon functional verification of state-of-the-art hardware designs, such as microprocessors and microcontrollers, presents many challenges. For example, the use of non-deterministic elements, commonly signified by X, for logic minimization and partial reset of large datapath registers can be effective in reducing the power and area consumption of certain logic in the chip. In certain cases, X's are also inserted to test hypothetical scenarios for improving coverage and other aspects of the design. However, the use of X's introduces verification challenges if not coupled with systematic methodologies and tools that can show that the non-determinism introduced by the X's does not propagate to the outputs of the design.

Sequential X refers herein to the problem of deciding if certain sampling points, including outputs, of an RTL design are deterministic, even with the presence of X's inside the design—referring to detecting the presence of Don't Cares, or X's, on these points. In this disclosure, a formal expression of the Sequential X problem is presented and algorithms which provide varying checking completeness are examined. Reveal-SEQX, an implementation of a Sequential X consistency checker which uses the Reveal model checker and a specialized correctness generator is also described. Further description of the Reveal model checker may be found in Automatic Formal Verification of Control Logic in Hardware Designs, Z. Andraus, Ph.D Dissertation, University of Michigan, April 2009. Reveal-SEQX is applied on a number of publicly available designs to reason about their output Don't Cares. Lastly, it is shown how the methodology and tool are used to avoid "good" X's appearing as false alarms, and to prove that the design is free of output X's.

This section provides background information related to the present disclosure which is not necessarily prior art.

SUMMARY

This section provides a general summary of the disclosure, and is not a comprehensive disclosure of its full scope or all of its features.

A computer-implemented method is provided for verifying a hardware design for an electronic circuit. The method includes: providing a hardware design description for the electronic circuit; extracting a set of design elements from the hardware design description, where the set of design elements represent the electronic circuit in terms of signals and logical operations performed on the signals and the set of design elements includes deterministic elements having a value selected from zero or one and at least one non-deterministic element having a value denoted by a variable; assigning a first set of values to the deterministic elements of the electronic circuit; checking one or more sample points of the electronic circuit using the first set of values for the deterministic elements and across all possible values for the at least one non-deterministic element; and detecting non-determinism of the non-deterministic element on the one or more sample points of the electronic circuit when two values assigned to the at least one non-deterministic element yields different values at the one or more sampling points.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Corresponding reference numerals indicate corresponding parts throughout the several views of the drawings.

DETAILED DESCRIPTION

Example embodiments will now be described more fully with reference to the accompanying drawings.

First, the behavior of a digital design is formalized using an intuitive notion that represents the design with hardware components reacting to input sequences. The emphasis is on the usage model and methodology rather than rigorous model checking or sequential equivalence checking theories. In a design with non-determinism due to partially initialized registers or the use of X in various forms, the values observed on the outputs are characterized with respect to determinism and whether the correct design description is sufficiently masking the non-determinism from the outputs.

A hardware design can be described as a tuple $\langle V, INIT, Trans \rangle$, where $V = I \cup S \cup C$, and I is the set of input variables, S is the set of state-holding variables, and C is the set of intermediate combinational variables. Each variable is a vector of 1-bit components, and each can take the value of 0 and 1. Thus, the valuations of an n-bit variable belongs to $\{0, 1\}^n$. With a fully initialized design and no use of X, the valuations of all the design variables are deterministically dependent on the inputs. Non-determinism is present when some components can take either 0 or 1 even if the inputs are fully specified. In this disclosure, this is referred to as X or Don't Care, interchangeably. A formal verification engine will exhaustively try 0 or 1 in place of the X, in order to determine certain properties. Therefore, the formal analysis is based solely on the $\{0, 1\}$ domain.

Let $\mathbb{S}$, $\mathbb{C}$ and $\mathbb{I}$ denote the sets of all possible valuations of S, C and I, respectively. INIT is a subset of $\mathbb{S}$ representing the group of initial states. Trans: $\mathbb{S} \times \mathbb{I} \to \mathbb{S} \times \mathbb{C}$ is a transition function such that (s',c)=Trans (s, in) where s, in and c are the valuations of S, I and C respectively at the current time frame, and s' is the valuation of S at the next time frame. We focus in this disclosure on designs with a single clock domain. In such designs, the succession of time frames is defined by the edges of the most frequent clock in the system.

Let $M=\langle V, INIT, Trans \rangle$ be a hardware design. Let $(s_1, \ldots, s_{n_s})$, $(c_1, \ldots, c_{n_c})$ and $(i_1, \ldots, i_{n_l})$ denote the elements of S, C and I respectively. Let $proj_s(s,j)$ return the valuation of $s_j$ under s. In other words $s=\langle proj_s(s,1), \ldots, proj_s(s,n_s) \rangle$. Let $proj_c$ and $proj_I$ be defined similarly. Let $val_M(s,in,v)$ denote the valuation of the variable v, given that the valuation of S is s, and the valuation of I is in. $val_M$ is computed using the proj and Trans functions. Formally, $$val_M(s, in, v) = \begin{cases} proj_s(s, j); & v = s_j \\ proj_I(in, j); & v = i_j \\ proj_c(c, j); & v = c_j, \text{ where } (s', c) = \text{Trans}(s, in) \end{cases}$$

Given that, let $val_M^k$ be a generalization of val that takes into account the time frames of the design. Formally $val_M^k$ is defined recursively as follows:

$val_M^0(s, in, v) = val_M(s, in, v)$ $val_M^k(s, in_1, in_2, \ldots, in_{k+1}, v) = val_M^{k-1}(s', in_2, \ldots, in_{k+1}, v)$; where $(s', c) = \text{Trans}(s, in_1)$ In words, $val_M^k(s, in_1, in_2, \ldots, i_{k+1}, v)$ is the valuation of the variable v at the current time frame, the input at the current time frame is $in_{k+1}$.

Let $M=\langle V, INIT, Trans \rangle$ be a hardware design. Let $equal^k$: $INIT^2 \times \mathbb{I}^{k+1} \times (I \cup S \cup C) \to \{true, false\}$ be a function defined as $equal_M^k(s_0^1, s_0^2, in_1, \ldots, in_{k+1}, var) \equiv val_M^k(S_0^1, in_1, \ldots, in_{k+1}, var) = val_M^k(s_0^2, in_1, \ldots, in_{k+1}, var)$. If we let $\mathcal{O}=(o_1, \ldots, o_n\mathcal{O}) \in (I \cup S \cup C)^n\mathcal{O}$ denote the vector of outputs, then $equal_M^k(s_0^1, s_0^2, in_1, \ldots, in_{k+1}, o_j)$ is true for any input sequence and any two initial states if and only if, the input sequence cannot differentiate between the initial states based on the valuation of $o_j$. In many practical cases, a generalized notion of output equivalence is more suitable; each output is "guarded" by a valid bit, which determines whether the value on that output should necessarily be deterministic. In this disclosure, it is assumed, without loss of generality, that each output signal has a valid bit; an output signal without a valid bit can be described as an output signal with a valid bit set to the constant true; for this purpose, val (s,in,true)=true for any $s \in \mathbb{S} \in$ and in $\in \mathbb{I}$. The following generalizes the definitions of value to valid-value which takes into account the valid bit (if invalid, value is assumed to be 0), and of valid-equal to be the analogue of equal. Let $\mathcal{O}V=(ov_1, \ldots, ov_n\mathcal{O}) \subseteq (I \cup S \cup C \cup \{true\})^n$ $\mathcal{O}$ denote the vector of the valid bits, where $ov_i$ is the valid bit of $o_i$.

Let valid-value$_M^k$ INIT$\times \mathbb{I}^{k+1} \times (I \cup S \cup C \cup \{true\}) \times (I \cup S \cup C) \to \{true, false\} \times \mathbb{R}$ be defined as follows:

valid $- value_M^k(s_0, in_1, \ldots, in_{k+1}, \text{valid}, \text{var}) =$ $val_M^k(s_0, in_1, \ldots, in_{k+1}, \text{valid}), \text{value})$; where value $=$ $val_M^k(s_0, in_1, \ldots, in_{k+1}, \text{valid}) ? val_M^k(s_0, in_1, \ldots, in_{k+1}, \text{var}): 0$ Let valid-equal$_M^k$:INIT$^2 \times \mathbb{I}^{k+1} \times (I \cup S \cup C \cup \{true\}) \times (I \cup S \cup C) \to \{true, false\}$ be a function such that valid-equal$_M^k(s_0^1, s_0^2, in_1, \ldots, in_{k+1}, \text{valid}, \text{var})$=true if and only if valid-value$_M^k(s_0^1, in_1, \ldots, in_{k+1}, \text{valid}, \text{var})$=valid-value$_M^k(s_0^2, in_1, \ldots, in_{k+1}, \text{valid}, \text{var})$ Informally, if the design starts from the initial state $s_0^1$ or $s_0^2$ and gets the input sequence $in_1, \ldots, in_{k+1}$, the valuation of the valid bit "valid" should be the same, and if so the valuation of the variable "var" is the same as well.

Using this notation, a design with internal non-determinism has no asymptotically observable don't-cares if valid-equal can be established for all design outputs starting at a given time frame. As defined formally in the following definition:

Definition 1. A hardware design M is valid outputs consistent at (after)$k_0$, denoted by VOutput-Consistent-At (After) (M,$k_0$), if the following holds for $k=k_0$ ($\forall k \geq k_0$):

$\forall j \in \{1, \ldots, n\mathcal{O}\}, \forall s_0^1, s_0^2 \in INIT, \forall in_1, \ldots, in_{k+1} \in \mathbb{I}$:

valid-equal$_M^k(s_0^1, s_0^2, in_1, \ldots, in_{k+1}, ov_j, o_j)$

Informally, a hardware design passes VOutput-Consistent-After (M,$k_0$), if after getting $k \geq k_0$ inputs, the valuations of the valid bits are not affected by the initial state, and if a valid bit $ov_i$ valuation is true, the valuation of $o_i$ is not affected by the initial state.

Given a design $M=\langle V, INIT, Trans \rangle$ and $k_0$, the goal is to determine whether VOutput-Consistent-After (M,$k_0$) is true. This, in turn, proves that there are not observable don't-cares on the outputs starting at time frame $k_0$ for the given reset sequence.

This goal is equally applicable for chip-level and block-level descriptions. When performing analysis at the level of the chip, and particularly for microprocessors and microcontrollers, designers are often forced to differentiate between "good" and "bad" don't-cares on the outputs. For example, CPU designs are generally characterized by architectural and non-architectural elements, and a set of specification (ISA) that defines how the processor reacts to executing programs (i.e. their effect on the architectural elements from a programmer viewpoint), and defines environment constrains including legal versus illegal input sequences or programs. If a microprocessor design contains an unintialized architectural element, inconsistency will generally arise; the executing program may read the value of an uninitialized architectural element before writing to it, and in turn introduce an X on the output that would otherwise be absent if the program is legal. This imposes restrictions on the types of don't-cares that are acceptable on the outputs. For this purpose, it is suggested that the following alternative consistency criterion which takes into account the legality of the input.

Definition 2. A hardware design M is legally consistent at (starting from) $k_0$, denoted by Legally-Consistent-At (After) (M,$k_0$), if the following holds for $k=k_0(\forall k \geq k_0)$:

$\forall j \in \{1, \ldots, n\mathcal{O}\}, \forall s_0^1, s_0^2 \in INIT, \forall in_1, \ldots, in_{k+1} \in \mathbb{I}$:

legal$(in_1, \ldots, in_{k+1}) \Rightarrow$ valid-equal$_M^k(s_0^1, s_0^2, in_{k+1}, ov_j, o_j)$ Where legal: $\mathbb{I}^* \to$ boolean returns true if and only if according to the specification of the design behavior the input sequence is well defined and a valid output is expected to react to it. The function legal is usually infeasible to accurately define in a way that allows practical reasoning approaches to yield meaningful results. In the following section, a methodology is presented that allows the user to (partially) define the legality of an input stream either through invariants or properties imposed directly on the input stream or through imposing constraints on the design components that affect the propagation of don't-cares.

An efficient realization of the Sequential X detection system relies on duplicating the design in order to allow simultaneous examination of different assignments to non-deterministic components, while exhaustively examining all possible combinations of the deterministic components that drive values to the circuit (inputs and state initializations). Given a design D that is being checked for X consistency, two instances of the design $D_1$ and $D_2$ are created. Across the two instances, components with deterministic values are tied, including inputs and register initialization, while allowing non-determinism for others by leaving them duplicated. A component is marked as "Safe-X" if its corresponding components are tied together so that X originating from them are not leading to violating the consistency check. The following describes the general case where only inputs are marked as Safe.

Figure 1:
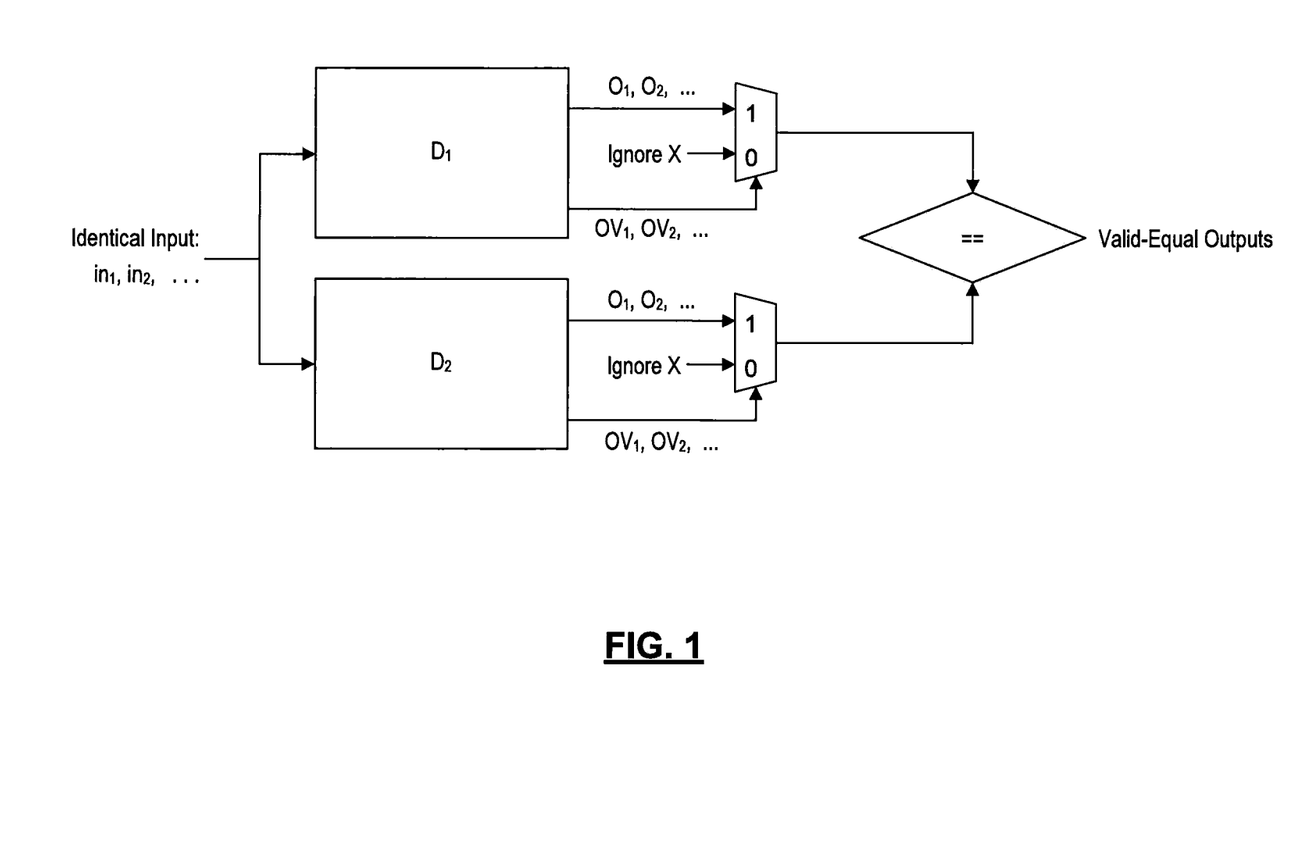
FIG. 1 is a diagram illustrating an example method for detecting non-determinism in a hardware design.

With reference to FIG. 1, the most generic X check allows for a qualifier or valid bit, which indicates when X is allowed. For each observation point $o_j$, with a valid bit $ov_j$, let $o^1{}_j$, $o^2{}_j$ be correspond to $o_j$ in $D_1$, $D_2$, and $ov^1{}_j$ corresponds to $ov_j$ in $D_1$, then the wire $o_j$_consistent=$ov^1{}_j$?($o^1{}_j$==$o^2{}_j$):1'b1 is used to model the function at the observation point, and the conjunction of all the wires is defined as outputs_consistent=$\wedge_{j=1}^{j=n} \mathcal{O} o_j$_consistent. Checking that outputs_consistent=true indicates that no X is shown on the observable points. This check can be done with any model checker.

Methodology for approximating legal X behavior is further described below. One can use Definition 1 as a first order approximation for the consistency criterion in Definition 2 assuming a tautological "legal" function. In this case, valid-equal will generally fail and return a witness showing an X on the output; in other words, a don't-care originating from an uninitialized element and propagating to the output. Diagnosing this case may determine that it is a "good" don't-care, and as a result there is a need for fixing a bug in the design logic, or ignoring the X showing on the output, or permanently resetting the source state element and paying a certain cost of area and power. Otherwise, this is a "bad" don't-care, i.e., a false alarm originating particularly from architectural elements. To eliminate this, the designer may decide to reset the register for verification purposes, but this may mask bugs that are otherwise present in the original design. Instead, this methodology allows the user to mark the register as "Safe" for X purposes.

The methodology allows the designer to mark an X-generating register as Safe, by checking whether all the outputs are consistent given that the subset $S_{safe} \subseteq S$ is initialized consistently to a random value. In most practical cases, choosing $S_{safe}$={uninitialized architectural registers} will prune out "false alarms" in which don't-care values are being propagated from free architectural elements. We will next present the formal definition for this criterion, analyze its relation to the previous criterion, and address its limitations and ways to improve upon it.

Definition 3. A hardware design M is $S_{safe}$ safe X consistent at (starting from) $k_0$, where $S_{safe} \subseteq S$, denoted by Safe-X-Consistent-At (After) (M,$k_0$,$S_{safe}$), if the following holds for k=$k_0$($\forall k \geq k_0$):

$$\forall j \in \{1, \ldots, n\mathcal{O}\}, \forall s_0^1, s_0^2 \in \text{INIT}, \forall in_1, \ldots, in_{k+1} \in \mathbb{I}:$$

$$UA\text{-legal}(in_1, \ldots, in_{k+1}) \vee [\text{consistent}(s_0^1, s_0^2, S_{safe}) \wedge OA\text{-legal}(in_1, \ldots, in_{k+1})] \Rightarrow$$

$$\Rightarrow \text{valid-equal}_M^k(s_0^1, s_0^2, in_1, \ldots, in_{k+1}, ov_j, o_j)$$

Where consistent is a relation such that consistent ($s_0^1, s_0^2, S_{safe}$) $\Leftrightarrow \forall s_j \in S_{safe}$: $\text{proj}_s(s_0^1, j) = \text{proj}_s(s_0^2, j)$, U A-legal is an under-approximation of the function legal (i.e. U A-legal$\subseteq$legal), and O A-legal is an over-approximation of the function legal (i.e., legal$\subseteq$O A-legal). Under-approximations are usually added by restricting inputs through constant assignment or adding assumptions on a group of inputs or design elements. Over-approximations are usually specified through invariants that were previously proven for the design.

Figure 3:
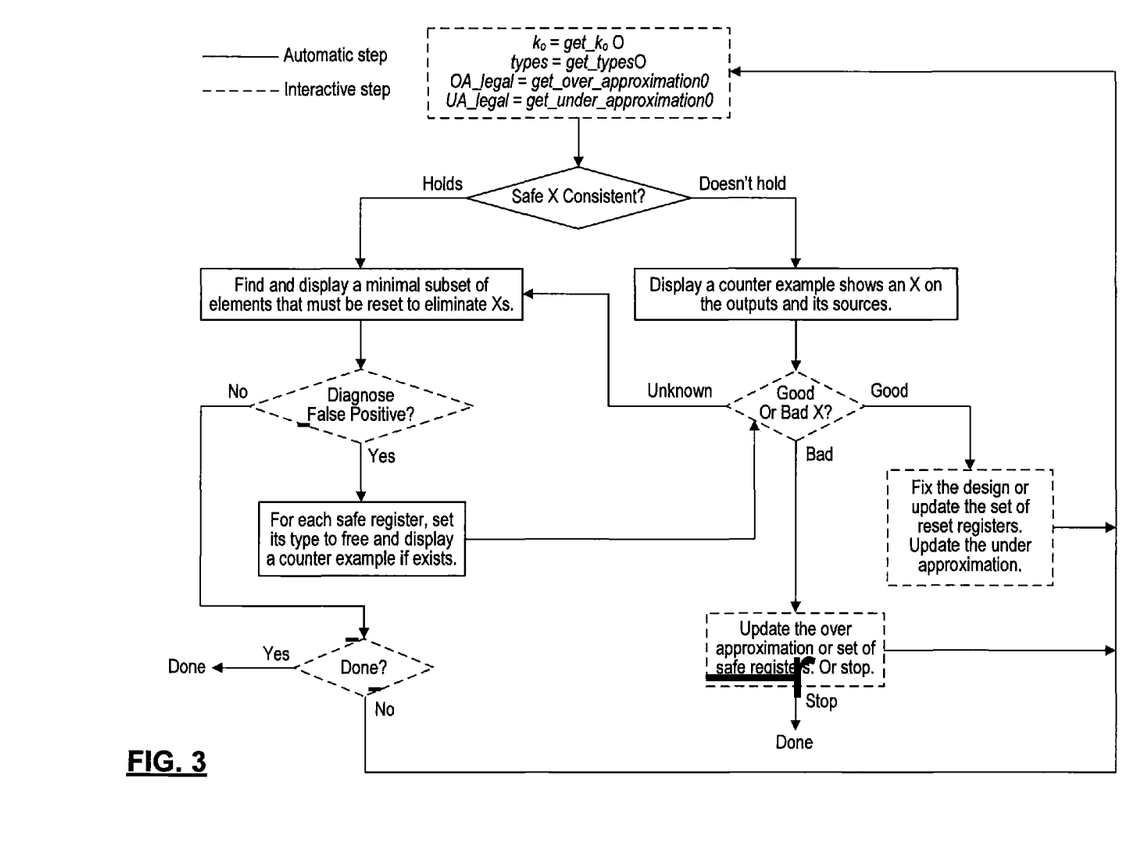
FIG. 3 is a flowchart depicting a general iterative methodology for verifying a hardware design.

With reference to FIG. 3, an iterative methodology is described in which the designer modifies the design to prune out the false counterexamples by initializing some uninitialized registers or marking them as safe, and tries to minimize the number of reset registers. Assume that each state element $s_j \in S$ has a type $t_i \in$ {free,safe,reset} and $s_{reset} \in$ INIT be the reset state. In this case $S_{safe}$ is equivalent to $\{s_j \in S: t_j = \text{safe}\}$. Given the vector $\bar{t}$, and the reset state $s_{reset} \in$ INIT (the state in which the design will be when all the registers are reset), let apply (M=$\langle$V,INIT,Trans$\rangle$ ,$s_{reset}$,$\bar{t}$) be a function that applies the reset values from $s_{reset}$ onto the state elements. Formally, apply (M=$\langle$V,INIT,Trans$\rangle$ ,$s_{reset}$,$\bar{t}$) returns M'= $\langle$V,INIT',Trans$\rangle$, where INIT'=$\{s_0 \in$INIT$|\forall j$: ($t_j$=reset)$\Rightarrow \text{proj}_s(s_0, j) = \text{proj}_s(s_{reset}, j)\}$.

Given over- and under-approximations of the function legal, the type of each register, and $k_0$ provided by the user, the design is first checked for consistency via the Safe-X-Consistent-After criterion applied on the design (registers are either reset, marked as safe, or left uninitialized). If the check fails, a counterexample is generated alongside a list of registers that are contributing to the X's showing on the outputs. Based on that and the knowledge about the design, the user can determine whether this is a false alarm involving illegal input or a genuine case indicating a potential bug in the design or lack of reset. The user may then update the type map and the approximations and re-iterate, or invoke an algorithm that computes a minimal set of registers whose reset can eliminate the X from the outputs, which helps in updating the type map and the approximations. The formulation of this process, which is also relevant in the case that the consistency check passes (need to minimize the registers being reset), is explained in the next sub-section. Provided the set $S_{safe}$ that was created incrementally (through interactive work with the tool) or a-priori, and after automatically minimizing the reset subset, the user may want to diagnose the proof for false positives, or minimize the reset subset further based on the design knowledge and input legality. For each Safe register $s_j$ the Safe-X proof is re-run after setting $t_j$ to free, if no counterexample is found, the register $s_j$ should not be in $S_{safe}$; otherwise, the counterexample is displayed, at which point the user can update the over approximation if the counterexample is "bad", or fix the design if it is a "good" counterexample.

This methodology provides a framework for an automated Safe X consistency check method. The method also allows over and under approximations to be used to constrain the design behavior. Furthermore, this method enables minimizing the initialization of registers for the purpose of saving area and power, while checking that adding X as a result of non-initialization does not lead to undesired observable X. An example of implementing the third method using the X consistency check is by iteratively and exhaustively un-initializing registers that are initialized in the original circuit, and for each un-initialization combination, the X consistency check is applied. If the proof passes in a given iteration, the register(s) that were purposely un-initialized introduced an X that was not observable on the sample points, and thus can be left without initialization in the original circuit. In other words, the X consistency check is not only a method for validating the current initialization and lack thereof (which introduces X), but also improving the circuit to further introduce safe X values that save area and power.

Figure 4:
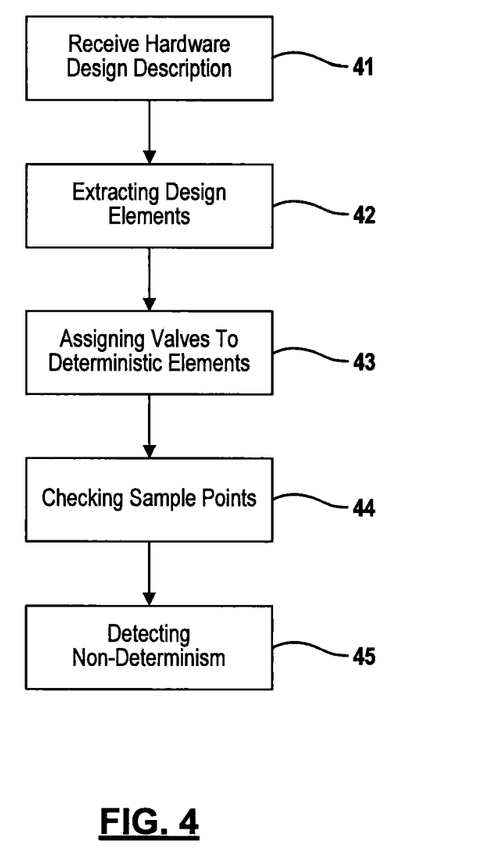
FIG. 4 is a flowchart depicting an example method for verifying a hardware design.

FIG. 4 provides an overview of a computer-implemented method for verifying a hardware design in accordance with this disclosure. In an example embodiment, a hardware design description is provided at 41 for an electronic circuit using a hardware description language, such as Verilog. It is readily understood that other representation of the electronic circuit are contemplated by this disclosure.

A set of design elements is first extracted at 42 from the hardware design description, where the set of design elements represent the electronic circuit in terms of signals and logical operations performed on the signals. For example, design elements may include but are not limited to gates, flip-flops, etc. The set of design elements may include deterministic elements and non-deterministic elements, where a deterministic element has a value selected from zero or one and a non-deterministic element has a value denoted by a variable, such as X. For illustration purposes, a deterministic element may be an initialized register, while a non-deterministic element may be a non-initialized register.

One or more sample points of the electronic circuit are then checked as indicated at 44. Referencing the notation above, VOutput-Consistent-After $(M, k\_0)$ can be proven with any model checker. To do so, a first set of values are assigned to each deterministic element of the electronic circuit. The electronic circuit is then checked across all possible values for the non-deterministic elements. For a given non-deterministic element, non-determinism is indicated when two values assigned to the given non-deterministic element yield different values at one or more sampling points. The process may be iterated as necessary (e.g., exhaustively unless prevented by constraints) using a different set of values of the deterministic elements of the circuit. As noted above, this method is not limited to any particular type of model checker.

The remainder of this disclosure describes a more efficient approach that examines non determinism on intermediate points in the design, such as state holding variables. For a given hardware design D that is being checked, two instances of the design $D_1, D_2 \ldots D_n$, are created. For each state holding variable $s_j$, let $s^1_j, s^2_j$ be correspond to $s_j$ in $D_1$, $D_2$, then the wire $s_j\_consistent = (s^1_j == s^2_j)$ is used to indicate that the state holding variable is consistent, and the conjunction of all the wires is defined as $states\_consistent = \wedge_{j=1}^{j=n} \mathcal{O} s_j\_consistent$. Algorithm 1 shows how this is done using an auxiliary method that checks states_consistent starting at a given cycle $k_0$.

An example of an improved implementation given in Algorithm 2 borrows the concept of "valid bits" to state elements, such that $s_j\_consistent = sv^1_j?(s^1_j == s^2_j):1'b1$. The logic representation of the valid bits is dependent on the circuit at hand. The algorithm uses an inductive argument based on the valid bits as a way to temporally abstract the behavior of the design with respect to non-determinism in the registers. The variation given in Algorithm 3 describes the case where valid bits are used in conjunction with marking registers as Safe-X.

Definition 4. A hardware design M is state consistent at k', denoted by State-Consistent-At (M,k'), if the following holds for k=k':

$$\forall s_0^1, s_0^2 \in \text{INIT}, \forall in_1, \ldots, in_{k+1} \in \mathbb{I}, \forall j \in \{1, \ldots, n_s\}:$$

$$val_M^k(s_0^1, in_1, \ldots, in_{k+1}, s_j) = val_M^k(s_0^2, in_1, \ldots, in_{k+1}, s_j)$$

Informally, if we start from any initial state and get any $k_0$ inputs, the valuation of S will be independent of the initial state.

Assertion 1. $\forall k \in \mathbb{N}$: State-Consistent-At $(M,k) \Rightarrow$ VOUTPUT-Consistent-At$(M,k)$ Assertion 2.
$((\forall k \in \{k_0, k_0+1, \ldots, k'\}$ VOutput-Consistent-At $(M,k)) \wedge$ State-Consistent-At $(M,k')) \Rightarrow$ VOutput-Consistent-After $(M,k_0)$ The following algorithm is based on assertions (1) and (2), which can be shown trivially. It attempts to find a pivotal k' that satisfies assertion (2). If the algorithm is unable to find such a k', it will attempt to prove that $\forall k \in \{k_0, k_0+1, \ldots, k_{max}\}$: VOutput-Consistent-At (M,k), where, $k_{max}$ is a given parameter.

---

Algorithm 1

For k' ← $k_0$ to $k_{max}$
    If (! (VOutput-Consistent-At (M, k')))
        print "The design is not consistent starting from $k_0$"
        return 0
    If (State-Consistent-At (M, k'))
        print "The design is consistent starting from $k_0$"
        return 1
print "The design is consistent $\forall k \in \{k_0, k_0 + 1, \ldots, k_{max}\}$."
return 2

---

Algorithm 1 passes on two illustrative examples as will be described below. On real-life designs, however, a modified version of Algorithm 1 was used in order to achieve a proof with unbounded depth. Similarly to the outputs, it uses "valid bits" for the state-holding variables, and attempts to prove an invariant on the state-holding variables that can lead to convergence on verifying the property. Note also that Algorithm 1 assumed no X on inputs or wires. Algorithms 2 and 3 below make no such assumptions.

Without loss of generality, assume that each state-holding variable has a valid bit. Let $SV = (sv_1, \ldots, sv_{n_s}) \subseteq (\mathbb{I} \cup \mathbb{S} \cup \mathbb{C} \cup \{true\})^{n_s}$ denote the vector of the valid bits, where $sv_j$ is the valid bit of $s_j$.

Definition 5. A hardware design M is valid states consistent at k', denoted by VState-Consistent-At (M,k'), if the following holds for k=k':

$$\forall s_0^1, s_0^2 \in \text{INIT}, \forall in_1, \ldots, in_{k+1} \in \mathbb{I} \; \forall j \in \{1, \ldots, n_s\}$$

$$valid\text{-}equal_M^k(s_0^1, s_0^2, in_1, \ldots, in_{k+1}, sv_j, s_j)$$

Definition 6. A hardware design M satisfies the Valid state consistent invariant, denoted by VState-Consistent-Invariant (M), if the following holds $\forall \hat{k} \in \mathbb{N}$:

$(V\text{state-Consistent-}At(M, \hat{k})) \Rightarrow (V\text{State-Consistent-}At(M, \hat{k}+1))$ Definition 7. A hardware design M satisfies the unobservable X invariant, denoted by Unobservable-X-Invariant (M), if the following holds $\forall k \in \mathbb{N}$:

(VState-Consistent-$At(M,\hat{k})$) $\Rightarrow$ (VOutput-Consistent-$At(M,\hat{k})$)

Definition 8. A hardware design M is inductively consistent, denoted by IC (M), if the following holds:

(VState-Consistent-Invariant(M) $\wedge$ Unobservable-X-Invariant(M))

Assertion 3.
(($\forall k \in \{k_0, k_0+1, \ldots, k'\}$:VOutput-Consistent-At(M,k)) $\wedge$ VState-Consistent-At(M,k') $\wedge$ IC (M)) $\Rightarrow$ VOutput-Consistent-After (M,$k_0$)

The following algorithm is based on assertion (3), which can be shown trivially. It attempts to find a pivotal k' such that VState-Consistent-At (M,k') holds. If such a k' is found, and IC (M) holds, then the design is consistent starting from $k_0$. Otherwise, it will attempt to prove that $\forall k \in \{k_0, k_0+1, \ldots, k_{max}\}$:VOutput-Consistent-At (M,k), where $k_{max}$ is a given parameter.

| Algorithm 2 VOutput-Consistent-After-Test (M, $k_0$, $k_{max}$) |
| --- |
| (01)  k' $\leftarrow$ $k_0$ |
| (02)  While (k' $\leq$ $k_{max}$) |
| (03)    If (!( VOutput-Consistent-At (M, k'))) |
| (04)      print "The design is not consistent starting from $k_0$" |
| (05)      return 0 |
| (06)    If ( VState-Consistent-At (M, k')) |
| (07)      break |
| (08)    k' $\leftarrow$ k' + 1 |
| (09)  If(k' $\leq$ $k_{max}$ && IC (M)) |
| (10)    print "The design is consistent starting from $k_0$" |
| (11)    return 1 |
| (12)  While (k' $\leq$ $k_{max}$) |
| (13)    If (! (VOutput-Consistent-At (M, k'))) |
| (14)      print "The design is not consistent starting from $k_0$" |
| (15)      return 0 |
| (16)    k' $\leftarrow$ k' + 1 |
| (17)  print "The design is consistent $\forall k \in \{k_0, k_0 + 1, \ldots, k_{max}, \}$" |
| (18)  return 2 |

Without loss of generality, in what follows we will extend the previous algorithms for the cluster of designs that are "consistently initialized", as defined below, for the purpose of safe-X.

Definition 9. Let M be a hardware design. $s_j$ is a consistently initialized state–holding variable, denoted by Consistently-Initialized-Variable (M,$s_j$) if the following holds:

$\forall s_0^1, s_0^2 \in INIT: proj_s(s_0^1, j) = proj_s(s_0^2, j)$

Informally, $s_j$ is a consistently initialized state–holding variable, if its valuations in all of the initial states are the same.

Definition 10. Let M be a hardware design. $s_j$ is a free–state holding variable, denoted by Free-Variable (M,$s_j$), if INIT is closed under changes in the value of $s_j$. Formally:

$\forall s_0^1 \in INIT, \forall y \in \mathbb{S}_j, \exists s_0^2 \in INIT$:

$proj_s(s_0^2, j) = y \wedge$ $\wedge \forall l \in \{1, \ldots, n_s\} \setminus \{j\}: proj_s(s_0^1, l) = proj_s(s_0^2, l)$ Where $\mathbb{S}_j$ denotes the set of all possible valuations of $s_j$. Here is an example illustrating Definitions 9 and 10:

```
reg s1, s2, s3, flag;
initial begin
    s1 = 0;              //s1 i consistently initialized.
                         //s2 is free.
    if (flag)s3 = 0;     //s3 and flag are neither consistently initialized nor
                         //free.
end
```

Definition 11. Let M be a hardware design. M is consistently initialized, denoted by Consistently-Initialized (M), if the following holds:

$\forall s_j \in S$: Consistently-Initialized-Variable($M, s_j$) $\vee$ ($M, s_j$) $\vee$ Free-Variable($M, s_j$)

Denote the set of all the free state-holding architectural variables of a microprocessor design CPU by $\mathcal{FR}$. Formally $\mathcal{FR} = \{s_j \in S \cap R : Free\text{-}Variable\ (CPU, s_j)\}$. Let $\mathbb{FR}$ denote the set of all possible valuations to the set $\mathcal{FR}$. While reference is made to a microprocessor, it is understood that the concept described herein are not limited thereto and is applicable to any hardware design or portions thereof Let the function reg-map (CPU, fr), where CPU= $\langle V, INIT, Trans \rangle$ is a microprocessor design, and fr$\in \mathbb{FR}$, return CPU'=$\langle V, INIT', Trans \rangle$, where INIT'={$s_0 \in$INIT|the valuation of $\mathcal{FR}$ in $s_0$ is fr}.

Assertion 4. Safe-X-Consistent-After (CPU,$k_0$)$\Leftrightarrow \forall fr \in \mathbb{FR}$:Consistent-After(reg-map(CPU,fr),$k_0$).

The RHS of assertion 4 can be checked by applying algorithm 2 with the reg-map option of reveal for an arbitrary $fr_0 \in \mathbb{FR}$.

| Algorithm 3 Safe-X-Consistent-After-Test (M, $k_0$, $k_{max}$) |
| --- |
| Results = {VOutput-Consistent-After-Test (reg-map (CPU, fr), $k_0$, $k_{max}$)\|fr $\in \mathbb{FR}$ |
| If (0 $\in$ Results) |
|   print "The design is not consistent starting from $k_0$" |
|   return 0 |
| If (2 $\in$ Results) |
|   print "The design is consistent $\forall k \in (k_0, k_0 + 1, \ldots, k_{max})$". |
|   return 2 |
| print "The design is consistent starting from $k_0$" |
| return 1 |

Figure 5:
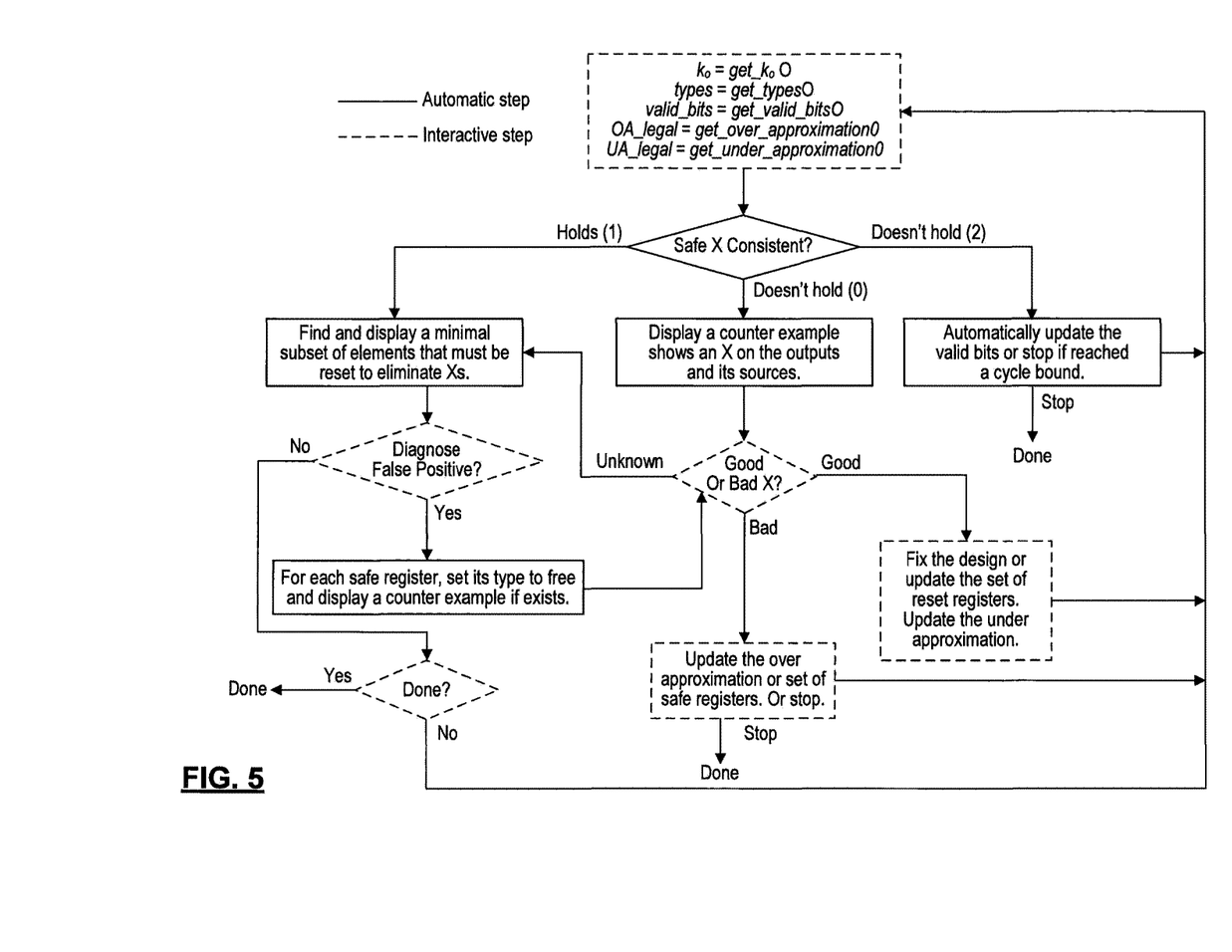
FIG. 5 is a flowchart depicting a refined version of the methodology shown in FIG. 3.

The methodology described in FIG. 5 refines the one shown in FIG. 3 based on Algorithm 3. The Safe-X-Consistent-After now results in either successfully proving the property, or failing due to two possible reasons; failure due to a legitimate counterexample, or failure due to a negative result in the induction (in which case Reveal-SEQX reports success for bounded equivalence with $k_{max}$). The rest of the flow is similar in the earlier case, while in the latter, an automatic algorithm can be used to update the valid bits.

Figure 2:
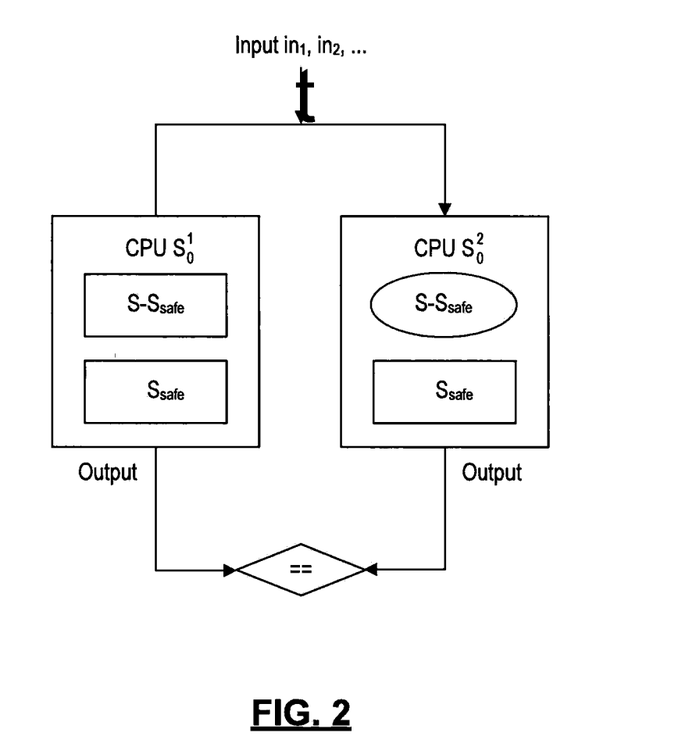
FIG. 2 is a diagram further illustrating the example method in which a designer is permitted to mark a register as Safe.

The Reveal-SEQX application integrates an implementation of Algorithm 3 and the Reveal model checker, based on the configuration in FIG. 2. The algorithm was run on a 64-bit Alpha processor, a 5-stage pipeline where much of the internal state is reset. The design is intended to have a register file attached to inputs and outputs of the core, but due to the nature of the Sequential X algorithm, we did not need to supply a safe-x list. The design is Safe-X consistent with $k_0=4$ and an empty $S_{safe}$. It also has been applied on a publicly available MIPS core, which is also a 5-stage pipeline, and contains 1615 single-bit registers, with $S_{safe}$ consisting of the architectural memories and the registers file. The run time for these examples on a machine with Intel Core i7 CPU 860 at 2.80 GHz and 8 GB memory is seconds to show a witness for an X bug, and minutes for a full proof.

The techniques described herein may be implemented by one or more computer programs executed by one or more processors. The computer programs include processor-executable instructions that are stored on a non-transitory tangible computer readable medium. The computer programs may also include stored data. Non-limiting examples of the non-transitory tangible computer readable medium are nonvolatile memory, magnetic storage, and optical storage.

Some portions of the above description present the techniques described herein in terms of algorithms and symbolic representations of operations on information. These algorithmic descriptions and representations are the means used by those skilled in the data processing arts to most effectively convey the substance of their work to others skilled in the art. These operations, while described functionally or logically, are understood to be implemented by computer programs. Furthermore, it has also proven convenient at times to refer to these arrangements of operations as modules or by functional names, without loss of generality.

Unless specifically stated otherwise as apparent from the above discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system memories or registers or other such information storage, transmission or display devices.

Certain aspects of the described techniques include process steps and instructions described herein in the form of an algorithm. It should be noted that the described process steps and instructions could be embodied in software, firmware or hardware, and when embodied in software, could be downloaded to reside on and be operated from different platforms used by real time network operating systems.

The present disclosure also relates to an apparatus for performing the operations herein. This apparatus may be specially constructed for the required purposes, or it may comprise a general-purpose computer selectively activated or reconfigured by a computer program stored on a computer readable medium that can be accessed by the computer. Such a computer program may be stored in a tangible computer readable storage medium, such as, but is not limited to, any type of disk including floppy disks, optical disks, CD-ROMs, magnetic-optical disks, read-only memories (ROMs), random access memories (RAMs), EPROMs, EEPROMs, magnetic or optical cards, application specific integrated circuits (ASICs), or any type of media suitable for storing electronic instructions, and each coupled to a computer system bus. Furthermore, the computers referred to in the specification may include a single processor or may be architectures employing multiple processor designs for increased computing capability.

The algorithms and operations presented herein are not inherently related to any particular computer or other apparatus. Various general-purpose systems may also be used with programs in accordance with the teachings herein, or it may prove convenient to construct more specialized apparatuses to perform the required method steps. The required structure for a variety of these systems will be apparent to those of skill in the art, along with equivalent variations. In addition, the present disclosure is not described with reference to any particular programming language. It is appreciated that a variety of programming languages may be used to implement the teachings of the present disclosure as described herein.

The present disclosure is well suited to a wide variety of computer network systems over numerous topologies. Within this field, the configuration and management of large networks comprise storage devices and computers that are communicatively coupled to dissimilar computers and storage devices over a network, such as the Internet.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed:

1. A method for producing a physical electronic circuit on a chip, the method comprising:
   checking for validity of an input stream for the physical electronic circuit, including:
   creating two design instances of the physical electronic circuit including:
      providing deterministic elements duplicated in the two design instances, the deterministic elements including inputs and register initialization for the two design instances, and
      providing non-deterministic elements duplicated in the two design instances, wherein the two design instances are not merged or deleted during the checking for validity of the input stream;
   tying the duplicated deterministic elements of the two design instances together so that each pair of duplicated deterministic elements in the two design instances receive the same input; and,
   sampling output from each of the two design instances when at least one pair of duplicated non-deterministic elements are initialized at different values so that a member of the at least one pair of duplicated non-deterministic elements in one design instance is initialized at a different value that a member of the at least one pair of duplicated non-deterministic elements in the other design instance.

2. A method of claim 1, wherein sampling output includes:
   providing input values to the two design instances; and
   comparing output values from each of the two design instances to identify any discrepancy in the output values from the two design instances.

3. A method as in claim 1, wherein the physical electronic circuit is a hardware device.

4. A method as in claim 1, wherein the physical electronic circuit is a device controlled by software.

5. A method for producing a physical electronic circuit, comprising:
   receiving a design description for the physical electronic circuit;
   extracting design elements, the design elements representing signals and logical operations performed on the signals, the design elements including deterministic elements that each have a value selected from zero or one and non-deterministic elements that need not be initialized for proper operation of the electronic circuit; and, checking for proper operation of the physical electronic circuit by initializing the deterministic elements and checking operation of the design description for values assigned to nondeterministic elements.

6. A method as in claim 5, additionally comprising:
assigning valid bits to state holding variables within the design description.

7. A method as in claim 5 wherein checking for proper operation of the physical electronic circuit includes:
creating two design instances of the design description including:
tying duplicated deterministic elements of the two design instances together so that each pair of duplicated deterministic elements in the two design instances receive the same input; and,
sampling output from each of the two design instances.

8. A method as in claim 5 wherein checking for proper operation of the physical electronic circuit includes:
creating two design instances of the physical electronic circuit including tying duplicated deterministic elements of the two design instances together so that each pair of duplicated deterministic elements in the two design instances receive the same input; and,
sampling output from each of the two design instances when at least one pair of duplicated non-deterministic elements are initialized at different values so that a member of the at least one pair of duplicated non-deterministic elements in one design instance is initialized at a different value than a member of the at least one pair of duplicated non-deterministic elements in the other design instance.

9. A method as in claim 5 wherein checking for proper operation of the physical electronic circuit includes:
creating two design instances of the physical electronic circuit;
tying inputs of the two design instances together so that each pair of duplicated inputs in the two design instances receive the same input values; and,
sampling output from each of the two design instances.

10. A method as in claim 5, wherein the physical electronic circuit is a hardware device.

11. A method as in claim 5, wherein the physical electronic circuit is a device controlled by software.

12. A method for producing a physical electronic circuit on a chip, the method comprising:
receiving a design description for the physical electronic circuit;
extracting design elements, the design elements representing signals and logical operations performed on the signals;
checking for proper operation of the physical electronic circuit by initializing deterministic elements in the design description and checking operation of the design description for values assigned to nondeterministic elements, including:
creating two design instances of the physical electronic circuit, wherein the two design instances are not merged or deleted during the checking for proper operation of the physical electronic circuit,
providing related input sequences to inputs of the two design instances, and
comparing corresponding outputs or other corresponding design elements for sets of input sequences.

13. A method as in claim 12, wherein comparing corresponding outputs or other corresponding design elements for sets of input sequences is performed exhaustively for a large set of input sequences or all input sequences.

14. A method as in claim 12, additionally comprising:
presenting a user with different output values between the two design instances using non-determinism or an X that shows on outputs or select design elements, where an X originates from a source and goes through or ends at destinations.

15. A method as in claim 14, additionally comprising:
providing the user an option to mark zero or more sources within the design description as safe, so that an algorithm ties the zero or more sources together, wherein when there are more than zero sources, the more than zero sources can be any combination that includes inputs, registers or floating wires.

16. A method as in claim 14, additionally comprising:
providing the user an option to mark zero or more differences or X destinations as invalid using bits that exist in the design description or are calculated by an algorithm, where X destinations are elements within the design description that exhibit Xs as a result of sources.

17. A method as in claim 14, wherein the user inspects non-determinism or X calculated by the algorithm and fixes the design description if there is a bug, refines the input assumptions, or marks X sources as safe.

18. A method as in claim 14, wherein an interactive algorithm maximizes or minimizes sources of X.

19. A method as in claim 14, wherein an algorithm finds non-determinism in registers or outputs of the design description using inductive reason based on valid bits logic.

* * * * *